(12) United States Patent
Nigam et al.

(10) Patent No.: US 9,344,050 B2
(45) Date of Patent: May 17, 2016

(54) DYNAMIC SPEAKER MANAGEMENT WITH ECHO CANCELLATION

(71) Applicant: Maxim Integrated Products, Inc., San Jose, CA (US)

(72) Inventors: Vivek P. Nigam, Sunnyvale, CA (US); Anthony S. Doy, Los Gatos, CA (US); Robert Polleros, Sunnyvale, CA (US)

(73) Assignee: Maxim Integrated Products, Inc., San Jose, CA (US)

(*) Notice: Subject to any disclaimer, the term of this patent is extended or adjusted under 35 U.S.C. 154(b) by 201 days.

(21) Appl. No.: 14/067,716

(22) Filed: Oct. 30, 2013

(65) Prior Publication Data

US 2014/0135078 A1  May 15, 2014

Related U.S. Application Data

(60) Provisional application No. 61/721,010, filed on Oct. 31, 2012, provisional application No. 61/721,015, filed on Oct. 31, 2012, provisional application No. 61/721,021, filed on Oct. 31, 2012.

(51) Int. Cl.
*H03G 3/00* (2006.01)
*H04M 9/08* (2006.01)
*H03G 9/02* (2006.01)

(52) U.S. Cl.
CPC ............. *H03G 3/00* (2013.01); *H03G 9/025* (2013.01); *H04M 9/082* (2013.01)

(58) Field of Classification Search
CPC .......... H03G 3/00; H03G 9/025; H04M 9/082
See application file for complete search history.

(56) References Cited

U.S. PATENT DOCUMENTS

2007/0140058 A1* 6/2007 McIntosh et al. ............. 367/140
2011/0194685 A1* 8/2011 van de Laar ............. 379/406.01

OTHER PUBLICATIONS

Bortoni, Constancio et al., "Real-Time Voice-Coil Temperature and Cone Displacement Control of Loudspeakers", AES 117th Convention, San Francisco, CA., Oct. 2004, pp. 2-8.

* cited by examiner

*Primary Examiner* — Sonia Gay
(74) *Attorney, Agent, or Firm* — TIPS Group

(57) ABSTRACT

A system for echo cancellation includes a dynamic speaker management (DSM) module, a current/voltage sensing amplifier, a sound pressure level (SPL) model module and an echo canceller. The example DSM module is receptive to a far-end signal and is operative to develop a modified far-end signal and a plurality of parameter outputs. The example current/voltage sensing amplifier is coupled to the modified far-end signal and develops an amplifier output, a voltage (V) parameter output, and a current (I) parameter output. The example sound pressure level (SPL) model module is coupled to the plurality of parameter outputs of the of the DSM module and is operative to develop a predicted SPL. The example echo canceller module is responsive to the predicted SPL and to a near-end signal and operative to develop an echo-canceled output signal.

13 Claims, 3 Drawing Sheets

DYNAMIC SPEAKER MANAGEMENT WITH ECHO CANCELLATION

CROSS REFERENCE TO RELATED APPLICATION(S)

This application claims the benefits of provisional patent application U.S. Ser. Nos. 61/721,010, 61/721,015 and 61/721,021, all filed Oct. 31, 2012, and all of which are incorporated herein by reference.

BACKGROUND

The current trend is to provide louder sound pressure level ("SPL") at the output of micro-speakers of a variety of devices such as feature phones, smartphones and tablets. Speakers may alternatively be referred to as "loudspeakers" herein. As well known to those of skill in the art, SPL is a measure of the change in sound pressure in front of a speaker caused by its operation.

A problem that occurs when increasing SPL levels in speakerphones is that it often causes the loudspeakers to operate in non-linear regions. When the devices are operated in a speakerphone mode, it becomes difficult to effectively cancel the echo made by direct and reflected acoustical paths between the speaker and the microphone.

FIG. 1 is a block diagram illustrating certain echo canceller systems of the prior art. In a first example, FIG. 1 shows a traditional echo canceller that works by feeding the far-end signal ("speech") as a reference R1 to an adaptive filter that models the acoustic feedback ("echo"). The output of the adaptive filter is subtracted from the microphone output to reduce the echo in the microphone signal. In a second example, the reference signal R1 is omitted and a reference signal R2 from a sensor S (e.g. an accelerometer or microphone) that is attached to the cone of a speaker is input into the adaptive filter.

A problem with the first example operation of the block diagram of FIG. 1 is that the reference R1 is not an accurate representation or "model" of the actual SPL variation at the speaker, resulting in poor echo cancellation. The second example operation results in a better representation or "model" of the SPL of the loudspeaker, but only at the cost of attaching a sensor S to the cone of the loudspeaker, affecting the speaker's SPL characteristics and adding to the cost of the system.

The error between the modeled acoustic feedback signals (e.g. R1 or R2) and the near-end signal microphone output can be used to adapt the adaptive filter and improve its performance. In a steady state, the adaptive filter learns to precisely model the acoustic feedback and the error is minimized. However, since the reference fed into a traditional echo canceller (e.g. R1) does not carry any information about the non-linearities introduced by loudspeaker, echo cancellers of the prior art that do not use a sensor S cannot cancel non-linear components, leading to more echo residual in the echo cancelled speech.

These and other limitations of the prior art will become apparent to those of skill in the art upon a reading of the following descriptions and a study of the several figures of the drawing.

SUMMARY

In an embodiment, set forth by way of example and not limitation, a system for echo cancellation includes a dynamic speaker management (DSM) module, a current/voltage sensing amplifier, a sound pressure level (SPL) model module and an echo canceller. The example DSM module is receptive to a far-end signal and is operative to develop a modified far-end signal and a plurality of parameter outputs. The example current/voltage sensing amplifier is coupled to the modified far-end signal and develops an amplifier output, a voltage (V) parameter output, and a current (I) parameter output. The example sound pressure level (SPL) model module is coupled to the plurality of parameter outputs of the of the DSM module and is operative to develop a predicted SPL. The example echo canceller module is responsive to the predicted SPL and to a near-end signal and operative to develop an echo-canceled output signal.

In an embodiment, set forth by way of example and not limitation, a method for modeling loudspeaker sound pressure level (SPL) includes: measuring a voltage (V) applied to a speaker coil and a current (I) flowing through the speaker coil to develop a V parameter and an I parameter; modeling the impedance of the speaker coil from the V parameter and the I parameter to provide a plurality of parameter outputs; modeling a predicted SPL for the speaker using the plurality of parameter outputs; and applying the predicted SPL to an echo canceller as a reference signal. In certain non-limiting examples, the plurality of parameter outputs includes a resonant frequency (Fe) parameter output and a total quality factor (Q) parameter output. In other non-limiting examples, the plurality of parameter outputs includes a d.c. coil resistance ($R_{dc}$) parameter output. In still further non-limiting examples, the plurality of parameter outputs include the V parameter and/or a modified far-end signal parameter. In certain non-limiting examples, a near-end signal is applied to the echo canceller.

An advantage of example systems and processes disclosed herein is that an accurate prediction of speaker SPL be obtained without affecting the speaker's SPL by attaching a sensor or the like to the cone of the speaker.

A further advantage of example systems and processes as disclosed herein is that louder, clearer sound can be derived from small form factor loudspeakers and enclosures by accurately and dynamically modeling the SPL of the loudspeakers.

A still further advantage of example systems and process disclosed herein is that an SPL model is developed which includes information about non-linearities introduced by the loudspeaker during high volume playback so that an adaptive filter of an echo canceller can cancel non-linear acoustic feedback more effectively.

These and other embodiments, features and advantages will become apparent to those of skill in the art upon a reading of the following descriptions and a study of the several figures of the drawing.

BRIEF DESCRIPTION OF THE DRAWINGS

Several example embodiments will now be described with reference to the drawings, wherein like components are provided with like reference numerals. The example embodiments are intended to illustrate, but not to limit, the invention. The drawings include the following figures.

DETAILED DESCRIPTION OF EXAMPLE EMBODIMENTS

Figure 1:
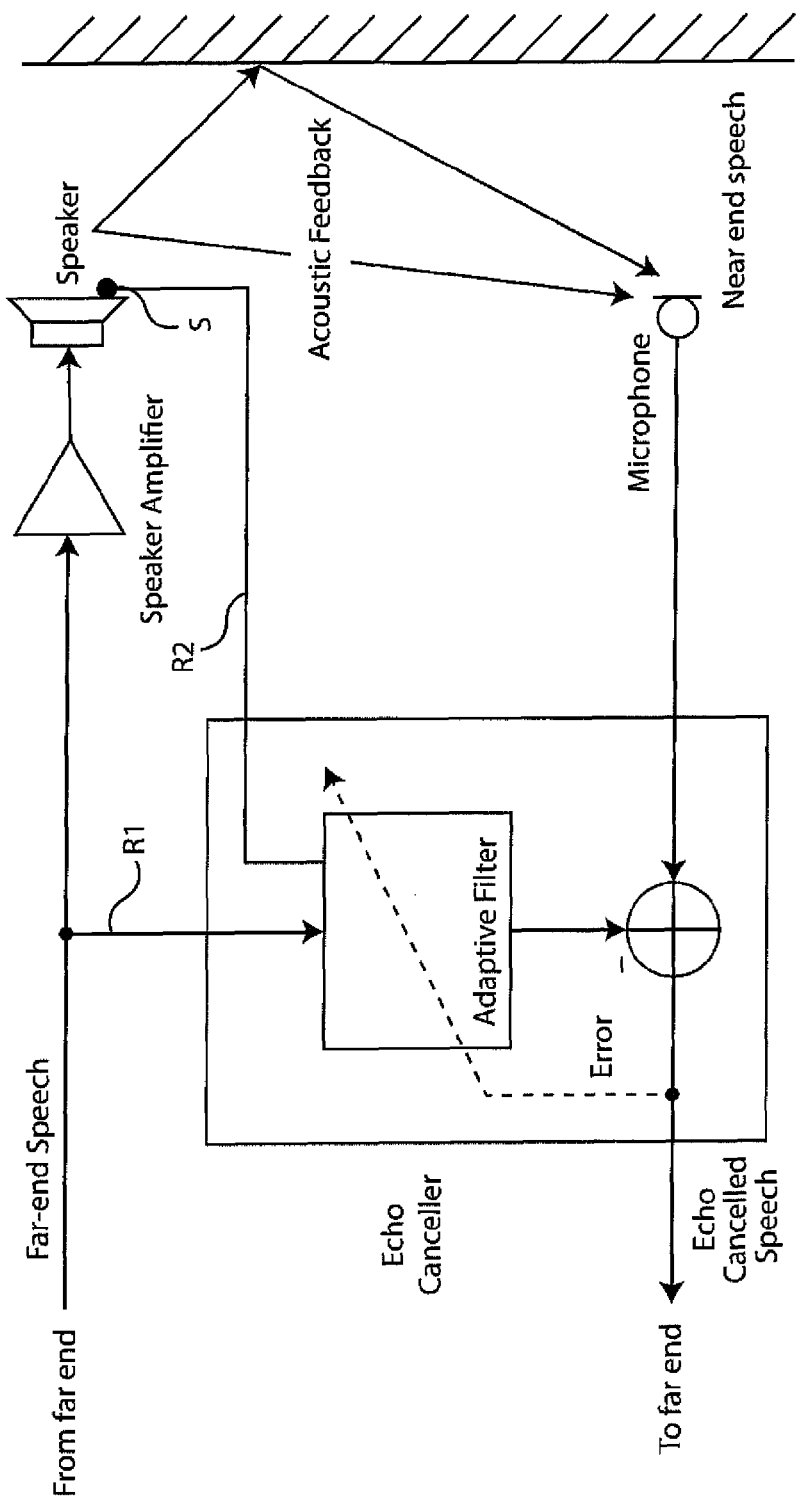
FIG. 1 is a block diagram illustrating echo canceller systems of the prior art.
Figure 2:
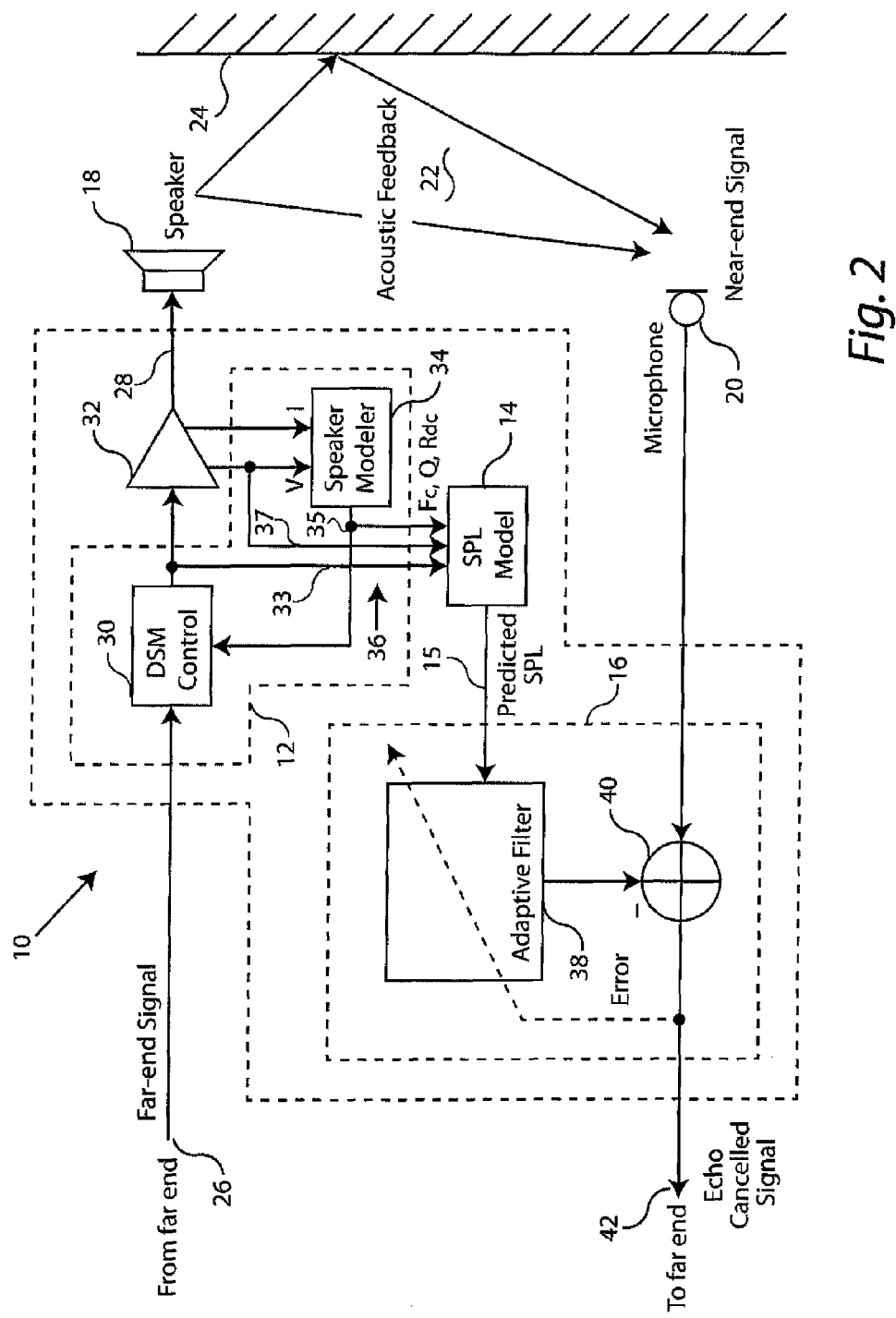
FIG. 2 is a block diagram illustrating example dynamic speaker management systems with echo cancellation.

FIG. 1 was discussed with reference to the prior art. FIG. 2 is a block diagram, set forth by way of example and not limitation, of a Dynamic Speaker Management ("DSM") system 10 including a DSM module 12, an SPL model module 14, an echo canceller module 16 and a current/voltage sensing amplifier 32. In this example, the DSM system 10 is coupled to a loudspeaker ("speaker") 18 and to a "near-end" microphone 20 of a portable electronic device such as a smartphone, tablet computer, etc. The loudspeaker 18 and microphone 20 are exposed to an ambient environment 22, such as a room, which may have one or more reflective surfaces 24. As noted, there are both direct and reflected acoustical paths through the air from the speaker 18 to the microphone 20, resulting in acoustic feedback at the microphone 20.

The DSM system 10 has an input 26, sometimes referred to as the "far-end" input which can include, for example, a far-end signal, which may also be referred to herein as "far-end speech." In the context of a smartphone, for example, this may come from the telephone's radio frequency (RF) receiver circuitry. The input 26 is processed by the DSM module 12 to maximize loudness of the signal and to provide information for the modeling of loudspeaker 18. An output 28 of the amplifier 32 drives the coils of loudspeaker 18 with a current I at a voltage V, in this non-limiting example.

DSM module 12, in this non-limiting example, includes DSM control block 30 and a speaker modeler 34. The DSM control block 30 has, as an input, the far-end signal and has, as an output, a modified signal referred to herein as "modified far-end signal" which is applied to the input of amplifier 32. In this example, the output of DSM control block 30 is input both into the amplifier 32 and into the SPL model module 14 via a line 33, although in other embodiments the line 33 may be omitted.

As noted above, the amplifier 32 provides the output signal 28 for the speaker 18 and also provides voltage V and current I parameters to the speaker modeler 34. The speaker modeler 34 provides an output 35 that is input into both the DSM control block 30 and the SPL model module 14.

SPL model module 14 is receptive to signals 36 one or more of the output of DSM control block 30 via line 33, outputs of a plurality of parameter outputs via line 35 of speaker modeler 34, and the voltage V parameter from amplifier 32 (which in some embodiments can replace the parameters from the DSM control block 30 on line 33). It uses algorithms to process and analyze signals 36 to predict, for example, the SPL of speaker 18, such that the transfer function of the acoustic feedback from ambient environment 22 can be accurately modeled.

In an embodiment, set forth by way of example and not limitation, the current I and voltage V can be used by speaker modeler 34 to model an impedance transfer function of the loudspeaker 18 by assuming that it is a second order ("linear") system in a given range of frequencies of interest (e.g. 0-4 KHz). Techniques such as a least-mean-squares method can be used to derive the impedance transfer function. In other embodiments, other models and techniques can be used, e.g. to model non-linear responses.

A resonant frequency "Fc" and a total quality factor "Q" can be calculated, in a non-limiting example, from the impedance transfer function derived by the speaker modeler 34. An SPL transfer function of the speaker 18 can be, by way of non-limiting example, modeled as a second order ("linear") high pass filter by using the calculated Fc and Q parameters. Alternatively, higher order system models may be generated to reflect non-linear responses of the loudspeaker 18, e.g. when it is being driven at high amplitudes. The SPL transfer function can then be used to transform the voltage V applied to the coils of loudspeaker 18 to its SLP response by SPL model module 14, which is then input into the echo canceller module 16.

Echo canceller module 16 can, in this non-limiting example, be conventional in design, and includes an adaptive filter 38 and an adder 40. Adaptive filter 38 is responsive to the predicted SPL developed by the SPL model module 14, and typically uses a number of filters and delays to model, as closely as possible, the inverse of the transfer function of the ambient environment 22. The output of the adaptive filter 38 is then summed with the output of microphone 20 to at least partially cancel out the acoustic feedback or "echo" of an output signal 42, referred to herein as "echo cancelled signal" or "echo cancelled speech."

An example operation of the DMS system 10, as illustrated in FIG. 2, is as follows. The far-end signal is processed by DSM module 12 to reduce distortion at higher playback volumes. The speaker modeler 34 processes the sensed voltage V and current I derived from the current/voltage sensing amplifier 32 to develop parameter outputs on line 35 such as its resonant frequency Fc, quality factor Q and d.c. coil resistance $R_{dc}$. These parameter outputs, for example, can be used by the SPL model module 14, along with other signals. It will be appreciated that the signals 36 contain information about the non-linearities introduced by the speaker during louder playback, such that the adaptive filter can cancel acoustic feedback more effectively.

Figure 3:
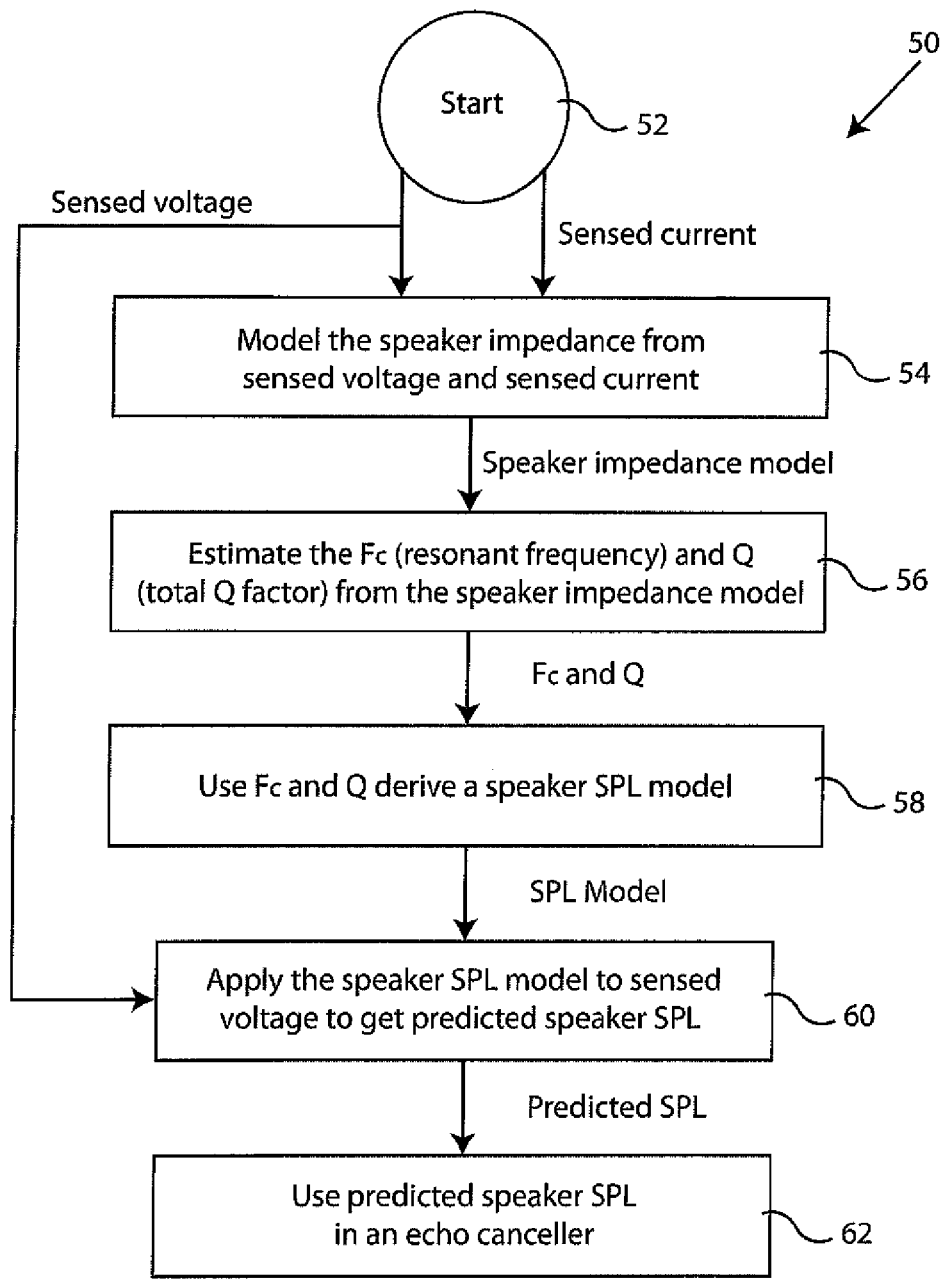
FIG. 3 is a flow diagram of an example SPL modeling process.

FIG. 3 is a flow diagram, set forth by way of example and not limitation, of a process 50 which may be implemented by DSM system 10 of FIG. 2. In this non-limiting example, process 50 starts at 52 by sensing a current I flowing through a speaker's coils and a voltage V applied to the coils. Next, in an operation 54, the sensed current I and voltage V are used to model the impedance of the loudspeaker, such as with speaker modeler 34 of FIG. 2. Operation 56 uses the speaker impedance model developed by operation 56 to calculate and estimated resonant frequency Fc and total quality factor Q. An operation 56 uses the calculated Fc and Q parameters to derive a speaker SPL model, such as in SPL model module 14 of FIG. 2. Next, in an operation 60, the voltage V (e.g. from line 35 of FIG. 2) is applied to the SPL model module 14, by way of non-limiting example, to develop a predicted SPL of the speaker, e.g. on line 15 of FIG. 2. Finally, in an operation 62, the predicted SPL is applied to the echo canceller 16 to provide the desired echo cancellation.

It should be noted that in the foregoing example embodiment, the output of DSM Control block 30 on line 33 is not used by the SPL model module 14. In an alternate example embodiment, the output of the DSM Control block 30 on line 33 is used in addition to the voltage V parameter on line 37, and in still further alternate example embodiments the output of the DSM control block 30 on line 33 is used instead of the voltage V parameter on line 37. Other parameter inputs serving similar purposes also apply.

The DSM system 10 and the example algorithms implemented thereby can be provided, for example, in whole or in part, using integrated circuit ("IC") technology. By way of non-limiting examples, the DSM system 10 can be implemented as part of an audio processing IC or digital signal processor ("DSP"), such as part number MAX98096 for an "Audio Hub with Wideband FlexSound Processor" of Maxim Integrated Products, Inc., d/b/a Maxim Integrated, of San Jose, Calif. It will also be appreciated that the functionalities of DSM module 12, SPL model module 14 and echo canceller module 16 can be implemented in hardware, software or combinations thereof. The processes can further be implemented by other processing devices, such as microprocessors, of a mobile device such as a Smartphone or tablet computer, by way of further non-limiting examples.

Although various embodiments have been described using specific terms and devices, such description is for illustrative purposes only. The words used are words of description rather than of limitation. It is to be understood that changes and variations may be made by those of ordinary skill in the art without departing from the spirit or the scope of various inventions supported by the written disclosure and the drawings. In addition, it should be understood that aspects of various other embodiments may be interchanged either in whole or in part. It is therefore intended that the claims be interpreted in accordance with the true spirit and scope of the invention without limitation or estoppel.

What is claimed is:

1. A system for echo cancellation comprising:
    a dynamic speaker management (DSM) module receptive to a far-end signal and operative to develop a modified far-end signal and a plurality of parameter outputs;
    a current/voltage sensing amplifier coupled to the modified far-end signal and having an amplifier output, a voltage (V) parameter output, and a current (I) parameter output;
    a sound pressure level (SPL) model module coupled to the plurality of parameter outputs of the of the DSM module and operative to develop a predicted SPL; and
    an echo canceller module responsive to the predicted SPL and to a near-end signal and operative to develop an echo-canceled output signal.

2. A system for echo cancellation as recited in claim 1 further comprising a speaker coupled to the amplifier output of the current/voltage sensing amplifier and a microphone providing the near-end signal.

3. A system for echo cancellation as recited in claim 2 wherein the DSM module includes a DSM control block and a speaker modeler.

4. A system for echo cancellation as recited in claim 3 wherein the speaker modeler uses the V and I parameter outputs of the current/voltage sensing amplifier to develop a resonant frequency (Fc) parameter and a total quality factor (Q) parameter as parameter outputs of the DSM module.

5. A system for echo cancellation as recited in claim 4 wherein the speaker modeler uses the V and I parameter outputs of the current/voltage sensing amplifier to develop a d.c. coil resistance ($R_{dc}$) parameter as a parameter output of the DSM module.

6. A system for echo cancellation as recited in claim 5 wherein the V parameter is a parameter output of the DSM module.

7. A system for echo cancellation as recited in claim 5 wherein an output of the DSM control block is a parameter output of the DMS module.

8. A method for echo cancellation in a loudspeaker system comprising:
    measuring a voltage (V) applied to a speaker coil of a loudspeaker and a current (I) flowing through the speaker coil to develop a V parameter and an I parameter;
    modeling the impedance of the speaker coil from the V parameter and the I parameter to provide a plurality of parameter outputs;
    modeling a predicted sound pressure level (SPL) for the speaker using the plurality of parameter outputs;
    applying the predicted SPL to an echo canceller as a reference; and
    applying a near-end signal to the echo canceller;
    whereby the echo canceller develops an echo cancelled signal.

9. A method for echo cancellation in a loudspeaker system as recited in claim 8 wherein the plurality of parameter outputs include a resonant frequency (Fc) parameter output and a total quality factor (Q) parameter output.

10. A method for echo cancellation in a loudspeaker system as recited in claim 9 wherein the plurality of parameter outputs include a d.c. coil resistance ($R_{dc}$) parameter output.

11. A method for echo cancellation in a loudspeaker system as recited in claim 10 wherein the plurality of parameters include the V parameter.

12. A method for echo cancellation in a loudspeaker system as recited in claim 10 wherein the plurality of parameters includes a modified far-end signal parameter.

13. A method for echo cancellation in a loudspeaker system as recited in claim 8 further comprising applying a near-end signal to the echo canceller.

* * * * *